(12) United States Patent
Tseng

(10) Patent No.: US 6,576,555 B2
(45) Date of Patent: Jun. 10, 2003

(54) METHOD OF MAKING UPPER CONDUCTIVE LINE IN DUAL DAMASCENE HAVING LOWER COPPER LINES

(75) Inventor: Horng-Huei Tseng, Hsinchu (TW)

(73) Assignee: Vanguard International Semiconductor Corp. (TW)

( * ) Notice: Subject to any disclaimer, the term of this patent is extended or adjusted under 35 U.S.C. 154(b) by 116 days.

(21) Appl. No.: 09/755,850

(22) Filed: Jan. 5, 2001

(65) Prior Publication Data
US 2002/0125209 A1 Sep. 12, 2002

(51) Int. Cl.$^7$ ............................................. H01L 21/311
(52) U.S. Cl. ........................ 438/694; 438/700; 438/702
(58) Field of Search .................................. 438/691, 692, 438/694, 700, 702, 624, 625, 626, 627, 666, 669, 672

(56) References Cited

U.S. PATENT DOCUMENTS 6,211,063 B1 * 4/2001 Liu et al. .................... 438/618
6,215,189 B1 * 4/2001 Toyoda et al. ............... 257/750
6,323,118 B1 * 11/2001 Shih et al. ................... 438/624
6,384,480 B1 * 5/2002 McTeer ....................... 257/750

* cited by examiner

Primary Examiner—Kin-Chan Chen
(74) Attorney, Agent, or Firm—Blakely Sokoloff Taylor & Zafman

(57) ABSTRACT

A method of making upper conductive lines in dual damascene process having lower copper conductive lines is disclosed. The processes begin from a substrate having lower copper conductive lines and a via formed in the nitride layer. An oxide layer plays as IMD is then formed on the nitride layer. Next, the oxide layer is patterned to form trenches. Thereafter, a barrier layer is deposited on the resulting exposed surface. An anisotropic etching process is then carried out to form barrier spacers on the sidewall of the trenches. Subsequently, an inert gas bombardment is done to remove a copper oxide layer so as to clean a surface of the via. Next, a conductive layer refilled in the trenches followed by a CMP process is successively performed to form a plurality of upper conductive lines.

10 Claims, 3 Drawing Sheets

METHOD OF MAKING UPPER CONDUCTIVE LINE IN DUAL DAMASCENE HAVING LOWER COPPER LINES

FIELD OF THE INVENTION

The present invention relates to a semiconductor process, and more specifically, to a dual damascene process for copper interconnection line and via.

BACKGROUND OF THE INVENTION

The technology of fabricating integrated circuits (IC) continuous to advance in the number of transistors, capacitors, or other electronic devices which can be fabricated on a single IC chip. The increase level of integration is being achieved in large part depended on decreasing the minimum feature sizes and on the multi-level connection technology. However, many difficult problems in the multi-level metallization are demanded to improve. The problems are: (1) to deposit a void free inter-level dielectric (ILD) that can fill the small gaps between lines without reliability problem, (2) to provide an efficient damascene process for connecting between multiple wiring levels without misalignment during via hole and trenches patterning.

Recently, in U.S. Pat. No. 6,087,251, Hsu proposed a dual damascene process to solve the issues of complicated processes for an excessive number of IMD deposition steps and misalignment while forming via holes by photolithography and etching. The processes are as follows: firstly, referring to FIG. 1A, a cross-sectional view showing a semiconductor substrate 200 with first IMD layer 201 thereto connect devices (not shown) is provided. A silicon nitride layer 202 is then formed on the first IMD 201. Thereafter, the silicon nitride layer 202 is patterned to form trenches 204a, 204b and 204c.

As shown in FIG. 1B, a conductive layer is then refilled into the trenches. The conductive layer (not shown) over the level surface of the nitride layer 202 is removed to form conductive lines 206a, 206b, and 206c by CMP (chemical/mechanical polish) process. Referring to FIG. 1C, after a photoresist pattern 208 shields the conductive line 206b, an etch-back process is then done to remove away an upper portion of conductive lines 206a, 206c. The etch level comes up to leave about a predetermined thickness in the trenches so as to form lower conductive lines in trenches 206a' and 206c' and a via 206b.

Referring to FIG. 1D, refilling the trenches 206a' and 206c' with the nitride layer and using CMP to remove the excess nitride layer over surface level of the conducive line 206b are successively performed. After that an oxide layer 210 serves as a second IMD layer formed on the nitride layer 202 is followed.

Referring to FIG. 1E, the oxide layer 210 is then patterned to form horizontal trenches 212 until a surface of the via 206b is exposed. The trenches are then refilled with conductive layer. The metal removal over the oxide layer 210 by CMP is followed so as to upper conductive lines.

The aforementioned prior art defines the via and the trenches simultaneously without the step of defining the via hole and thus can solve the misalignment caused by the definition the via hole. In the case of copper as material of the lower conductive lines and the via some of the problems are necessary to overcome. For instance, the exposed surface of the copper via 206b is usually formed with a thin copper oxide layer. A plasma bombardment is necessary to be done to remove it. However, the copper-redeposit on the sidewall of the trenches 212 during sputtering the copper oxide on the via will degrade the quality of the oxide layer.

Hence, the motivation of the present invention-is to solve the problems of the contamination by copper redeposit.

SUMMARY OF THE INVENTION

An object of the present invention is to solver the problem of copper redeposit on the sidewall of the trenches when lower conductive lines are made of copper.

A method of making upper conductive lines in dual damascene process having lower copper conductive lines is disclosed. The method comprises following steps: first, a substrate having nitride layer is provided. The nitride is then patterned to form a plurality of first trenches therein. A copper layer is then refilled in the trenches. After a CMP process to remove a portion of the copper layer over a level of surface of the nitride layer so as to form a plurality of conductive lines, a mask pattern is then shielded one conductive line which is served as a via. Thereafter, each upper portion of the conductive lines are etched away until a predetermined thickness except the via which has a mask pattern to prevent from etch. After the mask pattern is removed, the trenches formed resulting from conductive line etching is then filled with a nitride layer. A CMP process is then followed to remove the excess nitride layer over a level of surface of the via, An oxide layer on the nitride layer is then formed and patterned to form trenches. A barrier layer is then deposited on the resulting exposed surface. An anisotropic etching process is then carried out to form barrier spacers on the sidewall of the trenches. Subsequently, an inert gas bombardment is done to remove a copper oxide layer so as to clean a surface of the via. Next, a conductive layer refilled in the trenches followed by a CMP process are successively performed to form a plurality of upper conductive lines.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENT

As forgoing prior art depicted in the background of invention, the dual damascene processes may suffer from many issues. The processes of the prior art embodiment though solve the misalignment between via and trench. However, for copper as material of lower conductive lines and the via, and for the upper conductive lines being a material other than copper, the copper redeposit will deteriorate the oxide layer during the removal of copper oxide by the plasma bombardment.

Figure 1E:
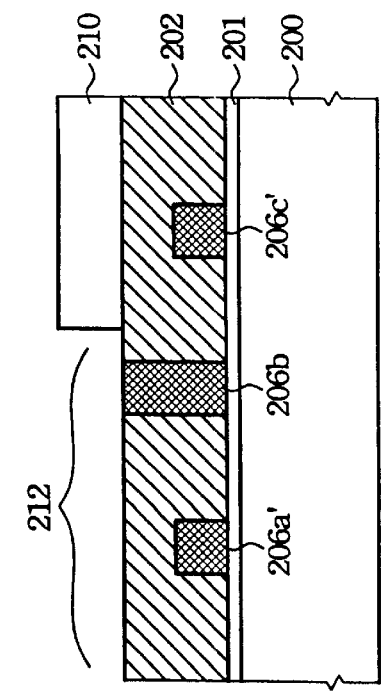
FIG. 1E is a cross-sectional view of forming horizontal trench in the oxide layer in accordance with the prior art.

The present invention can prevent copper from diffusing-into the oxide layer. The processes begin from the resulted process shown in FIG. 1E where a substrate having first IMD layer 201, nitride layer 202 and oxide layer 210 sequentially formed thereon are prepared. In the nitride layer 202, the lower copper-conductive lines 206a'–206c' thereto connect the devices (not shown) and the conductive line (not shown) in the first IMD layer 201 and a copper-via 206b formed thereto connect the upper conductive lines (they will be depicted later) which will be formed in the oxide layer 210, the second IMD layer 210. In the second IMD layer 210, the horizontal trench 212 is patterned through lithographic and etching process.

Figure 1C:
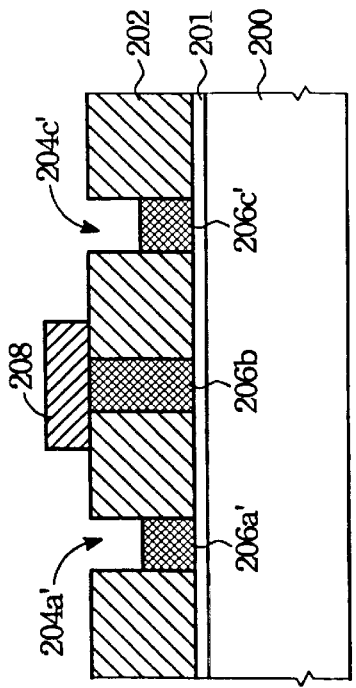
FIG. 1C is a cross-sectional view of forming a photoresist pattern to shield a conductive line which serves as a via in accordance with the prior art.
Figure 1D:
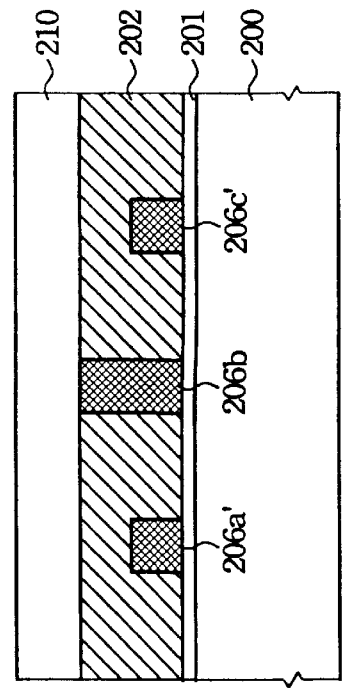
FIG. 1D is a cross-sectional view of forming lower conductive lines and a via in accordance with the prior art.
Figure 1A:
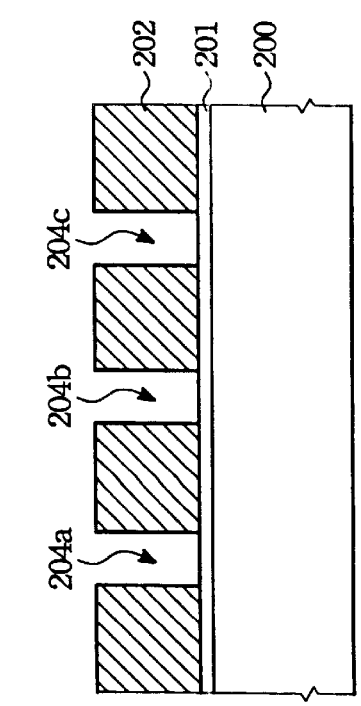
FIG. 1A is a cross-sectional view of forming trenches in a nitride layer in accordance with the prior art.
Figure 1B:
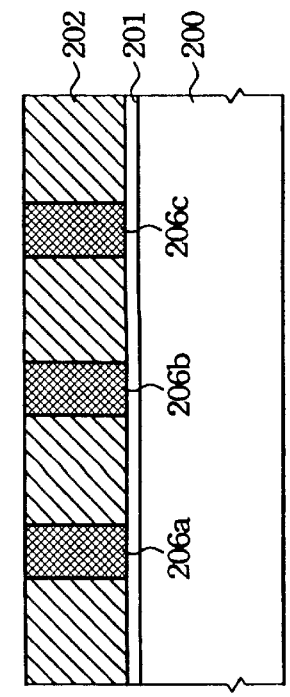
FIG. 1B is a cross-sectional view of refilled trenches with conductive layer in accordance with the prior art.
Figure 2A:
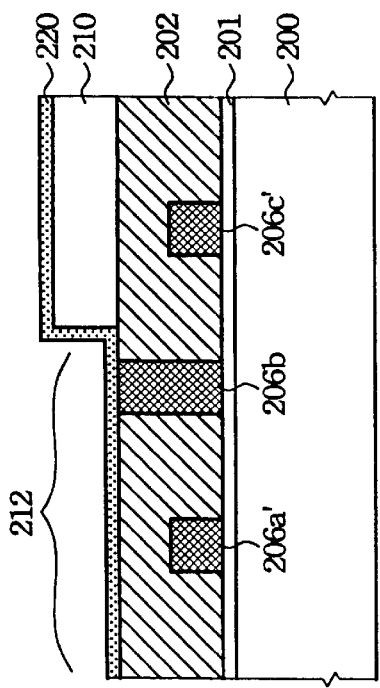
FIG. 2A is a cross-sectional view of forming barrier layer on the patterned oxide layer in accordance with the present invention.

Please turn to FIG. 2A, a barrier layer 220 is deposited atop the oxide layer 210, sidewall and a bottom of the trench 212. In a preferred embodiment, the barrier layer 220 is formed by PVD or CVD process and the barrier layer 220 material selected one from the group consisting of TiN, SiN, TaN, WN, Ta, W, Ti,.SiNx, SiC and the combination thereof.

Figure 2B:
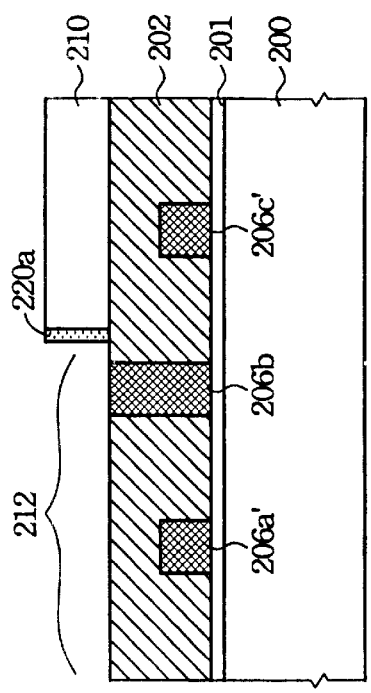
FIG. 2B is a cross-sectional view of forming spacer on the sidewall of the trench in accordance with the present invention.
Figure 1F:
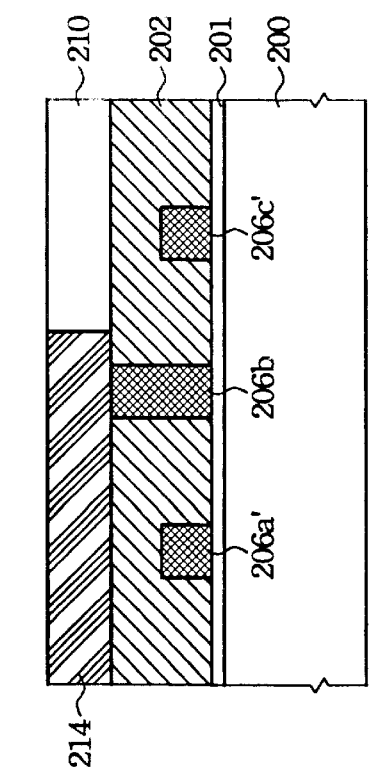
FIG. 1F is a cross-sectional view of forming upper conductive line in accordance with the prior art.

Referring to FIG. 2B, an anisotropic plasma etch back is then performed to form spacer 220a on the sidewall of the trench 212. This step is to expose atop of the surface of the via 206b.

Figure 2C:
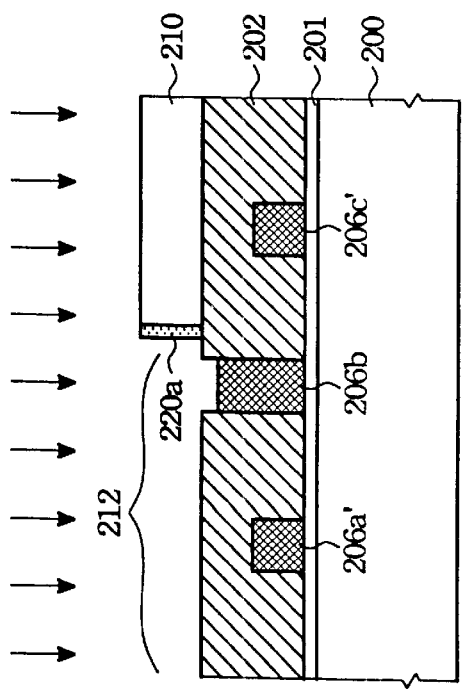
FIG. 2C is a cross-sectional view of performing argon plasma bombardment to remove copper oxide layer in accordance with the present invention.

Subsequently, a sputtering etch process is then carried out by inert gas plasma such as argon gas plasma to bombard the copper oxide layer on the exposed surface of the via 206a, as shown in FIG. 2C, Some of the copper atoms may also be etched away during the process. Thus the spacer 220a on the sidewall of the trench 212 serve to prevent the sputtering copper atoms from redepositing on the sidewall of the trench before pumping away. As the copper atoms redeposit on the sidewall without the barrier spacer 220a, the atoms may further diffuse into the oxide layer 210 to degrade electric isolating property.

Figure 2D:
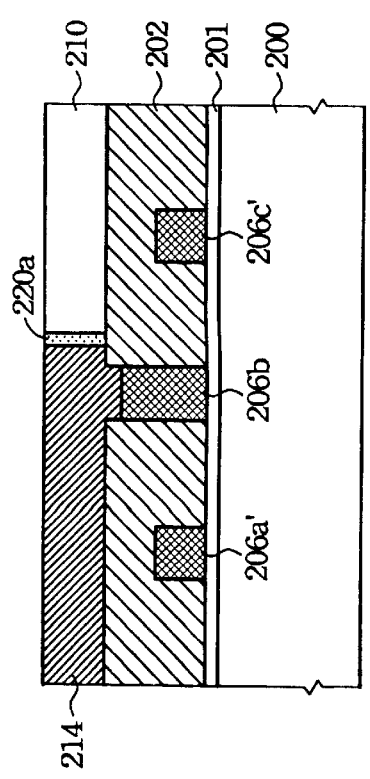
FIG. 2D is a cross-sectional view of forming upper conductive line in accordance with the present invention.

Referring to FIG. 2D, an upper conductive layer such as a copper layer, an aluminum layer or a tungsten layer deposition is then performed to refill completely into the horizontal trenches 212 by the sputtering process.

Thereafter, a portion of the upper conductive layer over the surface level of the second IMD layer 210 is removed by CMP process using the IMD as a stop layer. In the process, an upper conductive line 214 in the horizontal trench 212 is formed. In addition, the formed upper conductive line 214 is electrically coupled well to the conductive line 206b.

Figure 3:
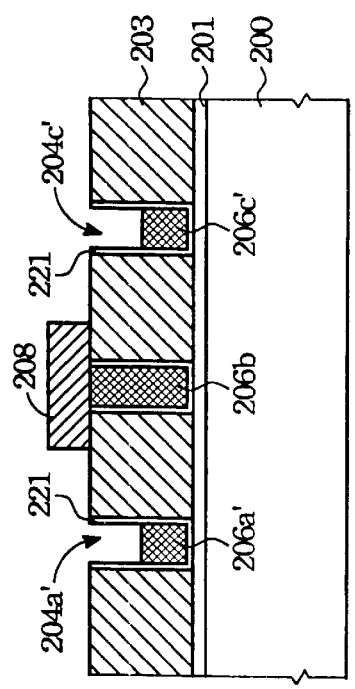
FIG. 3 is a cross-sectional view of forming upper conductive line in accordance with the present invention.

In prior art, the lower copper conductive lines are formed in the silicon nitride layer. The silicon nitride layer is known to have higher dielectric constant than silicon oxide. The present invention, however, can allow using the silicon oxide layer to replace for silicon nitride layer. The steps are similar to the aforementioned upper conductive line process except the barrier layer should not be etched back to form spacer but preserve it on the bottom of the trenches for copper conductive lines. For example, as shown in FIG. 3, the oxide layer 203, is patterned to form trenches firstly. And then before refilling the trenches 204a', 204b', and 204c' with copper, a barrier layer 220 is formed on the resulting surface and then copper layer is refilled. After that a CMP to remove the excess copper layer over surface of the oxide layer 203 is performed. The steps of shielding one conductive line for a via and etch back upper portion of exposed copper layer to form lower conductive lines 206a', 206c', and a via 206b are the same as before. However, in this case, using copper as a material of the upper conductive lines is not appropriate for the barrier layer 220 etched to form spacer will make the trench bottom loss the barrier layer.

The invention has following benefits:

The copper oxide bombardment incurred copper redepositing on the sidewall issue is overcome.

As is understood by a person skilled in the art, the foregoing preferred embodiment of the present invention is an illustration of the present invention rather than limitation thereon. It is intended to cover various modifications and similar arrangements included within the spirit and scope of the appended claims, the scope of which should be accorded the broadest interpretation so as to encompass all such modifications and similar structure.

What is claimed is:

1. A method of forming copper interconnection using dual damascene process, said method comprising the steps of:

providing a substrate;

forming a first dielectric layer on said substrate;

patterning said first dielectric layer so as to form a plurality of first trenches therein;

refilling said first trenches with a copper layer;

performing a CMP process to remove a portion of said copper layer over a level of surface of said first dielectric layer so as to form a plurality of conductive lines;

forming a mask pattern to cover at least one of said conductive lines which is served as a via;

etching away each upper portion of said conductive lines to a predetermined thickness, thereby forming lower conductive lines and second trenches thereover using said mask pattern as etching mask;

removing said mask layer;

refilling said second trenches with said first dielectric layer;

performing a CMP process to remove a portion of said first dielectric layer over a level of surface of said via;

forming a second dielectric layer on said first dielectric layer;

patterning said second dielectric layer to form a plurality third trenches and to expose said via;

forming a barrier layer on said second dielectric layer;

performing an anisotropic etching process to form barrier spacers on each sidewall of said third trenches;

bombarding and removing a copper oxide layer on said via so as to clean a surface of said via; and refilling said third trenches with a conductive layer;

performing a CMP process to remove a portion of said conductive layer over a level of surface of said first dielectric layer so as to form a plurality of upper conductive lines.

2. The method of claim 1, wherein said first dielectric layer comprises a silicon nitride layer.

3. The method of claim 1, wherein second dielectric layer comprises a silicon oxide layer.

4. The method of claim 1, wherein said barrier layer is selected from a conductive or dielectric material.

5. The method of claim 1, wherein said barrier layer is selected one from the group consisting of TiN, SiN, TaN, WN, Ta, W, Ti,.SiNx, SiC and the combination thereof.

6. The method of claim 1, wherein said conductive layer is selected one from the group consisting of W, Cu, and Al.

7. The method of claim 6, wherein said first dielectric layer comprises a silicon oxide layer.

8. The method of claim 6, wherein second dielectric layer comprises a silicon oxide layer.

9. The method of claim 6, wherein said barrier layer is selected one from the group consisting of TiN, SiN, TaN, WN, Ta, W and Ti.

10. A method of forming copper interconnection using dual damascene process, said method comprising the steps of:

providing a substrate;

forming a first dielectric layer on said substrate;

patterning said first dielectric layer so as to form a plurality of first trenches therein;

forming a first barrier layer on said first dielectric layer including sidewalls and bottoms of said first trenches, refilling said first trenches with a copper layer;

performing a CMP process to remove a portion of said copper layer over a level of surface of said first dielectric layer so as to form a plurality of conductive lines;

forming a mask pattern to cover at least one of said conductive lines which is served as a via;

etching away each upper portion of said conductive lines to a predetermined thickness, thereby forming lower conductive lines and second trenches thereover using said mask pattern to prevent said via from etching;

removing said mask layer;

refilling said second trenches with said first dielectric layer;

performing a CMP process to remove a portion of said first dielectric layer over a level of surface of said via;

forming a second dielectric layer on said first dielectric layer;

patterning said second dielectric layer to form a plurality third trenches and to expose said via;

forming a second barrier layer on said second dielectric layer;

performing an anisotropic etching process to form barrier spacers on sidewalls of said third trenches;

bombarding and removing a copper oxide layer on said via so as to clean a surface of said via; and refilling said third trenches with a conductive layer;

performing a CMP process to remove a portion of said conductive layer over a level of surface of said first dielectric layer so as to form a plurality of upper conductive lines.

\* \* \* \* \*